Oct. 28, 1969 J. V. LANE 3,475,717

ZERO FORCE CONNECTOR

Filed March 31, 1967

INVENTOR.
JOHN V. LANE
By John J. Leavitt
AGENT

United States Patent Office 3,475,717

Patented Oct. 28, 1969

3,475,717

ZERO FORCE CONNECTOR

John V. Lane, Granada Hills, Calif., assignor to International Telephone and Telegraph Corporation, New York, N.Y., a corporation of Maryland Filed Mar. 31, 1967, Ser. No. 627,439
Int. Cl. H01r *9/08, 13/54;* H05k *1/06*
U.S. Cl. 339—75 10 Claims

ABSTRACT OF THE DISCLOSURE

The connector is formed by a hollow receptacle having front, rear, side and end walls into the interior of which extend a plurality of juxtaposed resilient contact members forming at least one series. The receptacle and the resilient contact members within the receptacle are proportioned to permit insertion of an edge portion of a printed circuit board having printed circuit terminals thereon. Such insertion is effected without physical engagement between the resilient contact members and the circuit terminals so that the contact members do not impede insertion of the circuit board. After complete insertion of the printed circuit board, an actuator plate is moved into impinging engagement with the resilient contact members to displace them into resilient engagement with the printed terminals on the circuit board.

The invention relates to electrical connectors, and more particularly to the type of connector utilized to operatively interconnect a multiplicity of electronic components by means of the circuits imprinted on a printed circuit board.

BACKGROUND OF INVENTION

Conventional electrical connectors utilized for the purpose stated above require that a great deal of force be exerted to insert the printed circuit board into the receptacle which forms the connector. It is one of the objects of this invention to provide an electrical connector for printed circuit boards which reduces to substantially zero the insertion force required to insert a printed circuit board into the receptacle.

Conventional electrical connectors for printed circuit boards require the use of substantial insertion force because the strongly resilient multiplicity of electrical contacts within the receptacle frictionally impinge upon the circuit terminals printed on the circuit board from the moment the circuit board comes into engagement with the resilient contacts. Such impingement effects undesirable wear of the thin conductive layer imprinted on the circuit board, thus reducing the expected life of the printed circuit board. It is accordingly another object of the invention to provide an electrical connector for printed circuit boards in which physical engagement between the resilient contacts and circuit board terminals is not effected until after the circuit board is fully inserted into the receptacle.

For the reasons stated above, conventional circuit board connectors require that considerable force also be exerted to extract the printed circuit board from the receptacle. It is accordingly a still further object of the invention to provide an electrical connector in which the force required to extract the printed circuit board from the receptacle is reduced to substantially zero.

A still further object of the invention is the provision of an electrical connector for printed circuit boards in which resilient overtravel is provided to accommodate variations in tolerances due to wear and manufacturing inaccuracies.

The invention possesses other objects and features of advantage, some of which, with the foregoing, will be apparent from the following description and the drawings. It is to be understood however that the invention is not limited to the embodiment chosen for illustration, as it may be embodied in various forms.

SUMMARY OF INVENTION

In terms of broad inclusion, the low insertion force electrical connector or socket of the invention provides an elongated hollow receptacle into the hollow interior of which extend a multiplicity of electrical conductors to form at least one series of resilient contacts within the receptacle. The contact fingers are configured so that the printed circuit board may be fully inserted into the receptacle without impinging against the resilient contacts. After full insertion of the circuit board, actuator means within the receptacle are manipulable to impinge against the resilient contacts to bias them into engagement with the fully inserted printed circuit board.

DESCRIPTION OF THE PREFERRED EMBODIMENT

Figure 1:
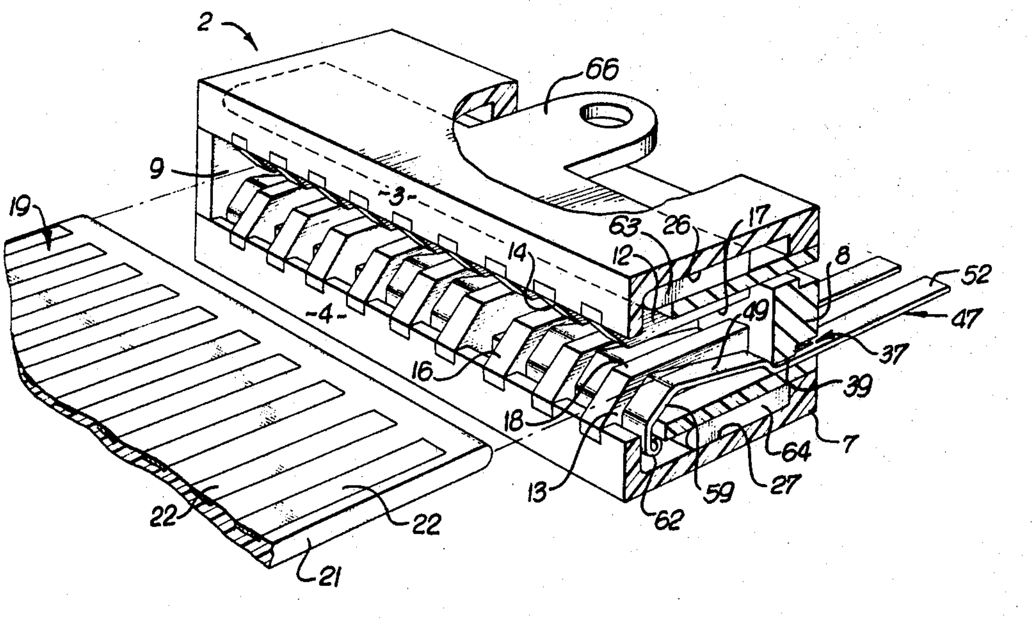
FIG. 1 is a fragmentary perspective view, partly in vertical section, illustrating the internal construction of the electrical connector in conjunction with a printed circuit board.

In terms of greater detail, the low insertion force electrical connector or socket of the invention comprises an elongated hollow receptacle or connector body arranged about a longitudinal axis and designated generally by the numeral 2. The receptacle is conveniently fabricated from a suitable synthetic resin having an appropriate dielectric constant, adapted to injection molding, and preferably having a high degree of dimensional stability.

The receptacle body is preferably formed with front wall sections 3 and 4, side walls 6 and 7, and rear wall 8. Front wall sections 3 and 4 are spaced apart as shown to provide an elongated aperture 9 opening into the receptacle. Within the hollow interior of the receptacle there are provided a pair of oppositely disposed series of rib or partition members 12 and 13, the ribs of each series extending from front to back within the receptacle and engaged at their forward ends to the front wall sections 3 and 4, respectively, and joined at their rear ends to the rear wall 8.

The ribs are spaced along the longitudinal axis of the connector, forming two separate series of opposed ribs, the ribs of each series defining between them a slot proportioned to receive a printed circuit board. The ribs 12 and 13, at their forward ends, are provided with inclined surfaces 14 and 16, respectively, which converge inwardly toward the longitudinal axis of the connector and merge with horizontally disposed inboard edges 17 and 18, respectively.

Figure 2:
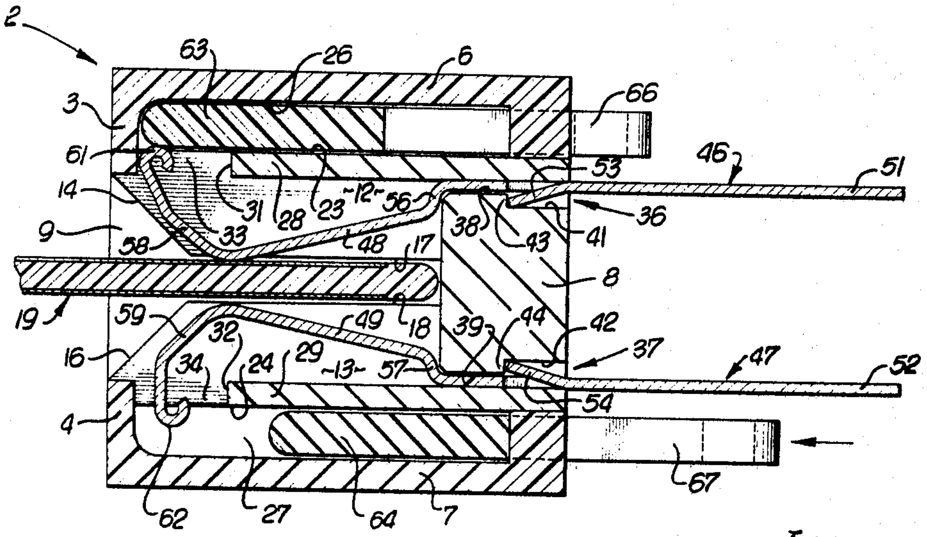
FIG. 2 is a vertical cross-sectional view illustrating the electrical connector in conjunction with a printed circuit board inserted thereinto and showing one series of resilient contact members displaced into engagement with the printed circuit board while the opposing series of resilient contact members is shown in its normal noncontacting position with respect to the associated printed circuit board. Both figures are shown greatly enlarged in the interest of clarity.

As shown best in FIG. 2, the longitudinal edges 17 and 18 of the ribs are spaced apart an amount slightly more than the thickness of a printed circuit board 19, adapted to be inserted through aperture 9 to lie in the slot between the inboard edges of the ribs.

The printed circuit board is conveniently fabricated from a dielectric base 21 and has thereon a plurality of circuits or circuit terminal members 22, in the form of a conductive coating printed on the base 21 in any desired pattern. The lateral spacing of the circuit board terminals 22 across the circuit board is proportioned to position the circuit board terminals 22 in association with the spaces between the ribs 12 and 13 of each series.

Ribs 12 and 13 are provided with outboard edges 23 and 24, respectively, extending substantially parallel to the longitudinal inboard edges 17 and 18 of the ribs and side walls 6 and 7. Outboard edges 23 and 24 of the ribs are spaced inwardly from the side walls 6 and 7 to provide a pair of passages or slideways 26 and 27 within the receptacle and lying next adjacent the side walls 6 and 7.

To lend rigidity to the ribs, the ribs of the two series 12 and 13 are joined together adjacent their outboard edges by wall or partition segments 28 and 29, respectively. The partition sections terminate at forward ends 31 and 32, which cooperate with the front wall portions 3 and 4 to define apertures 33 and 34 communicating the passage or groove between each pair of ribs in each series with the passages or slideways 26 and 27 lying adjacent the side walls 6 and 7.

Formed in the rear wall 8, and longitudinally spaced therealong, are a plurality of apertures designated generally by numerals 36 and 37 and arranged in two series. The series of apertures lie adjacent partitions 28 and 29, with the apertures formed with rectangular shallow sections 38 and 39, which at one end communicate with the spaces between adjacent ribs 12 and 13, and at their other ends communicate with relatively deeper sections 41 and 42. The transition between aperture sections 38, 41 and 39, 42 provides appropriate shoulders 43 and 44 which function as limit stops as will hereinafter be explained.

To make and break an electrical circuit through the receptacle with a properly inserted printed circuit board, electrical conductors are provided designated generally by numerals 46 and 47. The conductors are of stripform and extend through apertures 38, 41 and 39, 42 to provide resilient contact portions 48 and 49 within the receptacle, and terminal portions 51 and 52 outside the receptacle. The electrical conductors are provided intermediate their ends with mounting sections lying within the apertures formed in the rear wall, and have resilient tines 53 and 54, respectively, struck from the strips forming the electrical conductors.

Each tine is struck from and laterally displaced out of the plane of the conductor strip so as to releasably lodge behind an associated shoulder 43 or 44 when the electrical conductor strip is inserted into an aperture 36 or 37. Resilient tines 53 and 54 prevent movement of the associated electrical conductors to the left as viewed in FIG. 2. Movement of the electrical conductors to the right, as viewed in FIG. 2, is prevented by shoulders 56 and 57 abutting rear wall 8 and which connect the resilient contact portions 48–49 with the corresponding mounting sections of the conductors locked within the apertures in the rear wall.

Within the receptacle, the resilient contact portions 48 and 49 converge toward the front of the receptacle and toward each other in the nature of mirror images which converge toward a common plane. Intermediate the front and rear walls the resilient contact members change their directions to provide lever portions 58 and 59 which diverge toward side walls 6 and 7 to terminate in reentrant portions 61 and 62 projecting through apertures 33 and 34 in the partitions 28 and 29 as best shown in FIG. 2.

Means are provided within the receptacle, digitally manipulable from outside the receptacle, to impinge against the reentrant portions 61 and 62 of the resilient contacts to effect displacement thereof in a direction toward the central axis of the connector and away from the associated side wall. As shown best in FIG. 2, the passages or slideways 26 and 27 accommodate plates 63 and 64 provided with outwardly extending apertured tabs 66 and 67, respectively, which extend through appropriate apertures (not shown) formed in the rear wall. Plate portions 63 and 64 lie slidably disposed within slideways 26 and 27, respectively, guided on one side by partitions 28 and 29 and outboard edges 23 and 24 of ribs 12 and 13, and guided on the other side by walls 6 and 7, respectively.

As shown in FIG. 2, in the lower portion thereof, plate 64 has been retracted so that the inherent resilience in contact 49 causes the reentrant portion 62 to project through aperture 34 into the slideway occupied by plate 64. This is the normal position of the spring contacts 48 and 49 prior to manipulation of the actuator plates. As can be seen from the top portion of FIG. 2, movement of plate 63 forwardly in the slideway causes the forward end of the plate to impinge against the reentrant portion of the contact with the effect that the resilient portion 48 flexes to bring the resilient contact ino physically abutting and electrically conductive engagement with an associated terminal member on the printed circuit board.

It will thus be apparent that with both actuator plates 63 and 64 retracted into the position illustrated by actuator plate 64, the inherent resilience of contact members 48 and 49 causes the contact members to be biased away from the central plane ultimately occupied by the printed circuit board. In this position of the spring contacts, it will be apparent that the printed circuit board may be inserted into the slot between inboard edges 17 and 18 of ribs 12 and 13 with a low or no force required for such insertion. Once the inner end of the board has abutted the inner surface of the rear wall, electrical connection is then made by digitally manipulating the actuator plates so as to laterally displace the resilient contact members into physical and electrically conductive engagement with the associated printed circuit board terminals.

The embodiments of the invention in which an exclusive property or privilege is claimed are defined as follows:

1. A low insertion force electrical socket adapted to receive an edge portion of a printed circuit board having at least one contact terminal thereon, comprising an elongated hollow receptacle arranged about a longitudinal axis and having apertured front and rear walls connected by side and end walls, at least one electrical conductor extending into the receptacle through an aperture in the rear wall to provide a resilient contact portion within the receptacle and a terminal lead outside the receptacle, the contact portion within the receptacle normally lying in noncontacting relation with respect to a printed circuit board fully inserted into the receptacle to substantially reduce to zero the force required to insert the printed circuit board into the receptacle, and contact actuator means arranged within the receptacle to be selectively adjustable to effect displacement of the contact portion into and out of electrically conductive connection with an associated contact terminal on an inserted printed circuit board, comprising a plate slidably disposed within the receptacle and movable into and out of engagement with the contact portion to displace the contact portion in a direction generally perpendicular to the longitudinal axis of the receptacle.

2. The combination according to claim 1, characterized in that a plurality of electrical conductors extend into the receptacle to provide pairs of opposed contact portions spaced on opposite sides of said longitudinal axis.

3. The combination according to claim 1, characterized in that said contact actuator means includes a portion extending out of the receptacle digitally manipulable to effect displacement of the actuator means within the receptacle.

4. The combination according to claim 1, characterized in that said electrical conductor is supported intermediate its ends on said rear wall, and lock means are associated therewith including a jogged section formed in the conductor to provide a shoulder adapted to abut one side of the rear wall and a resilient tine spaced from the shoulder adapted to engage the other side of the wall when the electrical conductor is inserted through said aperture in the rear wall.

5. The combination according to claim 2, characterized in that a pair of said contact actuator means are provided operatively associated with said pairs of opposed contact portions spaced on opposite sides of said longitudinal axis.

6. The combination according to claim 2, characterized in that said contact actuator means displaces all contact portions simultaneously so as to simultaneously place all contact portions in electrically conductive connection with respectively associated contact terminals on the printed circuit board.

7. The combination according to claim 2, characterized in that a series of partitions is provided within the receptacle on opposite sides of the longitudinal axis and arranged to isolate the electrical conductors from each other, the adjacent edges of opposed partitions being spaced apart an amount sufficient to permit the insertion of a printed circuit board therebetween.

8. The combination according to claim 1, characterized in that partition means are provided within the receptacle parallel to said side walls and extending from said rear wall toward said front wall and providing an aperture adjacent said front wall through which a portion of the contact portion within the receptacle extends into abutting relation with the contact actuator plate when the latter is adjusted to displace the contact portion into engagement with an associated contact terminal on the printed circuit board.

9. The combination according to claim 4, characterized in that said resilient contact portion constitutes a cantilever anchored in the rear wall adjacent a side wall and configured to provide a resilient section generally perpendicular to the longitudinal axis and inclined inwardly toward a printed circuit board inserted into the socket and away from said side wall, said resilient inclined section merging integrally with an outwardly extending free end portion terminating adjacent the associated side wall.

10. The combination according to claim 1 wherein said plate is slidably disposed within the receptacle from the rear wall of said receptacle and wherein said electrical conductor contains a reentrant portion extending through an aperture portion formed by a partition in the receptacle, the sliding of said plate causing said contact portion to engage said contact terminal and move said reentrant portion into said aperture.

References Cited

UNITED STATES PATENTS

| | | | |
|---|---|---|---|
| 2,857,577 | 10/1958 | Vanderpool | 339—176 XR |
| 3,040,291 | 6/1962 | Schweitzer et al. | 339—176 |
| 3,329,926 | 7/1967 | Aksu et al. | 339—176 |

FOREIGN PATENTS

| | | |
|---|---|---|
| 863,049 | 3/1961 | Great Britain. |
| 885,040 | 12/1961 | Great Britain. |
| 1,398,310 | 3/1965 | France. |

RICHARD E. MOORE, Primary Examiner

U.S. Cl. X.R.

339—17, 176, 217